(12) United States Patent
Fukusen

(10) Patent No.: US 7,408,417 B2
(45) Date of Patent: Aug. 5, 2008

(54) FILTER AUTOMATIC ADJUSTMENT APPARATUS, FILTER AUTOMATIC ADJUSTMENT METHOD, AND MOBILE TELEPHONE SYSTEM

(75) Inventor: Masaru Fukusen, Osaka (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 92 days.

(21) Appl. No.: 11/391,195

(22) Filed: Mar. 29, 2006

(65) Prior Publication Data

US 2006/0220752 A1    Oct. 5, 2006

(30) Foreign Application Priority Data

Mar. 31, 2005    (JP) .............................. 2005-101154

(51) Int. Cl.
*H03L 7/00*    (2006.01)
(52) U.S. Cl. .................. 331/17; 333/17.1; 327/553; 327/554
(58) Field of Classification Search ............... 331/17; 333/17.1; 327/553, 554
See application file for complete search history.

(56) References Cited

U.S. PATENT DOCUMENTS

| | | | |
|---|---|---|---|
| 5,392,456 A * | 2/1995 | Mitomo et al. | 340/825.21 |
| 6,646,497 B2 * | 11/2003 | Tsuda | 327/552 |
| 6,658,244 B2 * | 12/2003 | Schmal et al. | 455/296 |
| 7,019,567 B2 * | 3/2006 | Katakura | 327/129 |
| 2002/0041201 A1 | 4/2002 | Tsuda | |
| 2006/0001482 A1 | 1/2006 | Nakamura et al. | |

FOREIGN PATENT DOCUMENTS

| | | |
|---|---|---|
| EP | 1 187 326 | 3/2002 |
| EP | 1 580 886 | 9/2005 |
| JP | 2002-76842 | 3/2002 |
| JP | 2004-172911 | 6/2004 |

* cited by examiner

*Primary Examiner*—Robert J. Pascal
*Assistant Examiner*—Levi Gannon
(74) *Attorney, Agent, or Firm*—Wenderoth, Kind & Ponack L.L.P.

(57) ABSTRACT

The invention provides a filter automatic adjustment apparatus and method, and a mobile telephone system, which realizes low power consumption while adjusting a characteristic frequency of a main filter having an adjustment function to a target frequency. The filter automatic adjustment apparatus includes: a phase difference detector 104 which outputs a signal having a duty ratio corresponding to a phase difference between an input signal and an output signal of a reference filter 103; a comparator 105 which converts the output signal of the phase difference detector into a rectangular wave; a counter 106 which consecutively counts a predetermined interval of the rectangular wave plural times; and a determination circuit 107 which selects a count value satisfying a predetermined criterion from the plural time count values, and the filter automatic adjustment apparatus adjusts the characteristic frequency of the main filter based on the selected count value.

15 Claims, 12 Drawing Sheets

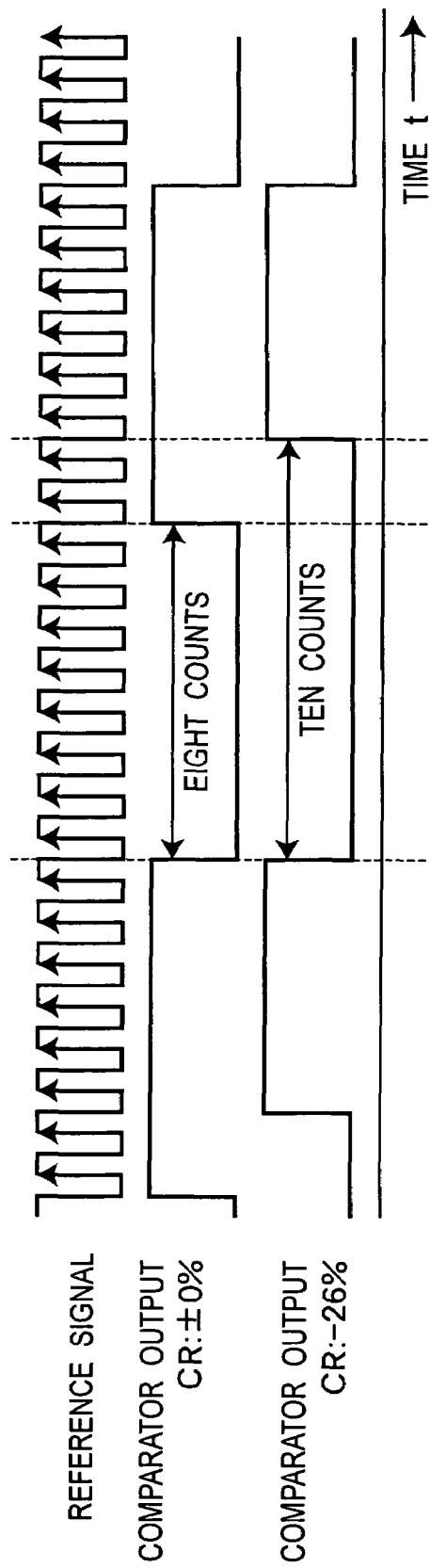

Fig.9

| DISPERSION OF CR PRODUCT (%) | PHASE DIFFERENCE θ (DEGREE) | | COUNT VALUE | ADJUSTED RATE OF RESISTANCE | APPARENT DISPERSION OF ADJUSTED CR PRODUCT (%) | |
|---|---|---|---|---|---|---|
| 30 | 15.1 | -110.6 | -101.3 | 6 | 0.816 | 6.1 | -6.1 |
| 15 | 0.1 | -101.2 | -90.1 | 7 | 0.930 | 6.9 | -6.9 |
| 0 | -13 | -90.0 | -78.8 | 8 | 1.070 | 7.0 | -7.0 |
| -13.1 | -25 | -78.7 | -67.6 | 9 | 1.235 | 7.4 | -7.4 |
| -25 | -30 | -67.5 | -62.7 | 10 | 1.380 | 3.4 | -3.4 | ately adjust the main filter even if the characteristic frequen-
FILTER AUTOMATIC ADJUSTMENT APPARATUS, FILTER AUTOMATIC ADJUSTMENT METHOD, AND MOBILE TELEPHONE SYSTEM

BACKGROUND OF THE INVENTION

1. Field of the Invention

The present invention relates to a filter automatic adjustment apparatus and a filter automatic adjustment method which adjust a characteristic frequency of a filter having an adjustment function to a target frequency and a mobile telephone system which includes the filter and the filter automatic adjustment apparatus.

2. Related Art

Recently, in respect of communication instruments (for example, a mobile telephone), development is focused on low-power consumption and miniaturization, and various wireless communication instrument parts tend to be integrated. The same tendency refers to the filter and the filter is frequently incorporated into the mobile telephone.

Generally, in production process of an integrated circuit, a dispersion of a resistor ranges from minus ten-odd percent to plus ten-odd percent, a dispersion of a capacitor ranges from minus ten-odd percent to plus ten-odd percent, and dispersion in characteristic frequency of a filter having the resistor and the capacitor ranges minus 20 percent to plus 20 percent. Correcting the dispersion is an important problem in incorporating the filter into the mobile telephone.

The term of characteristic frequency means a center frequency $f_0$ for a band-pass filter (BPF) and a cutoff frequency (frequency at −3 dB point) for a high-pass filter (HPF) and a low-pass filter (LPF).

Patent Document 1 (Japanese Patent Laid-Open No. 2002-76842) discloses a filter apparatus which adjusts a main filter (filter to be adjusted) by comparing phase of an input signal of a reference filter with phase of an output signal of the reference filter and feeding back the phase comparison result to the main filter. The filter apparatus measures dispersion of the CR product in the reference filter based on the phases of the input signal and output signal of the reference filter. Since the reference filter is similar to the main filter in a configuration, the dispersion of the CR product in main filter is known by measuring the dispersion of the CR product in the reference filter and the characteristic frequency of the main filter can be adjusted. Since the filter apparatus disclosed in Patent Document 1 is always operated, the filter apparatus can immediately adjust the main filter even if the characteristic frequencies of the reference filter and the main filter are shifted, for example, due to fluctuation in power supply.

Patent Document 2 (Japanese Patent Laid-Open No. 2004-172911) discloses a filter apparatus which measures dispersion of the CR product of a reference filter by comparing phase of an input signal of the reference filter with phase of an output signal of the reference filter and stores the phase comparison result in a register. The filter apparatus adjusts the main filter based on the phase comparison result stored in the register. The filter apparatus is powered off after the characteristic frequency of the main filter is adjusted once. Therefore, electric power consumption is prevented in a period during which the characteristic frequency of the main filter is not adjusted.

The filter apparatus of Patent Document 1 has an advantage that the characteristic frequency of the main filter is difficult to shift even if the fluctuation in power supply or the fluctuation in temperature is generated because the filter apparatus is always powered on to apply a feedback loop. However, the electric power is wasted in the reference filter, a phase difference comparator, and a control voltage generator which are not necessary to original wireless communication. Therefore, there is a problem from the viewpoint of the low power consumption.

In the mobile telephone into which the main filter and the filter apparatus are incorporated, when the power consumption of the filter apparatus is increased, a talk time of the mobile telephone in one battery charge is shortened. When the battery capacity is increased in order to secure the long talk time, miniaturization of the mobile telephone cannot be realized. In such circumstances, it is necessary to provide the filter apparatus in which the power consumption is low as much as possible.

The filter apparatus of Patent Document 2 is superior to the filter apparatus disclosed of Patent Document 1 in respect to achieve the low power consumption by turning off the internal blocks necessary to the filter adjustment after the adjustment is performed once. However, since the filter apparatus of Patent Document 2 measures the dispersion of the CR product in the reference filter having the same configuration as the main filter only once, when the reference filter has a bad noise characteristic or small input dynamic range, that is, when C (Carrier)/N (Noise) characteristic of the reference filter is bad, sometimes the measurement result is different from a correct value. When the measurement result of the incorrect value is used, the filter apparatus fails in adjusting of the main filter. Accordingly, the filter apparatus of Patent Document 2 can not accurately adjust the filter.

SUMMARY OF THE INVENTION

The present invention is to solve the foregoing problem and provides a filter automatic adjustment apparatus and a filter automatic adjustment method, which realize the low power consumption while adjusting accurately the characteristic frequency of the filter having the adjustment function, and a mobile telephone system.

A filter automatic adjustment apparatus of the invention, which adjusts a characteristic frequency of a main filter to a target frequency, includes: a reference filter; a measuring section that consecutively measures the characteristic frequency of the reference filter plural times; and a determination circuit that determines the characteristic frequency of the reference filter based on measurement results of the plural times; wherein the filter automatic adjustment apparatus adjusts characteristic frequency of the main filter according to the determination result of the determination circuit.

As used herein, the term "target frequency" means a characteristic frequency without dispersion. Since the characteristic frequency of the reference filter is measured plural times, the measurement result is a reliable correct value. For example, even if the reference filter has a bad noise characteristic or a small input dynamic range, that is, even if the reference filter has a bad C/N characteristic, the stable measurement result can be obtained by measuring plural times. The main filter can be adjusted with high accuracy by utilizing the measurement result of the correct value.

The measuring section may include: a phase difference detector which detects a phase difference between an input signal and an output of the reference filter to output a signal having a duty ratio corresponding to the phase difference; a comparator which converts an output signal of the phase difference detector into a rectangular wave to outputs the rectangular wave; and a counter which consecutively counts a predetermined interval of an output signal of the comparator plural times based on a reference signal; and the determination circuit may select a count value satisfying a predetermined criterion from the plural count values outputted from the counter.

The filter automatic adjustment apparatus may further include: a decoder which decodes a control signal for adjusting the characteristic frequency of the main filter to the target frequency based on the output signal of the determination circuit; and a register which stores the control signal outputted from the decoder.

The filter automatic adjustment apparatus may further include: a reference signal source which generates the reference signal to output the generated signal to the counter; and a frequency divider which creates a signal of the target frequency by dividing a frequency of the reference signal to output the signal of the target frequency to the reference filter.

Preferably the main filter and the reference filter are active filters each of which uses an operational amplifier. When the main filter has a resistor and a capacitor, a resistance of the resistor and/or a capacitance of the capacitor of the main filter may be changed according to the control signal. Since the characteristic frequency of the active filter which uses the operational amplifier is substantially determined only by the resistor and the capacitor, the active filter is hardly affected by a fluctuation in power supply of a fluctuation in temperature. Accordingly, the active filter is suitable to the invention which stores the adjustment result.

The main filter and the reference filter may be a gm-C filter including plural transconductance amplifiers and plural capacitors. In the gm-C filter, the filter characteristic frequency can be changed by current variable control or voltage variable control. The gm-C filter has a small number of resistors or capacitors, so that the gm-C filter has a large merit from the viewpoints of the miniaturization and the built-in filter.

Preferably the phase difference of the reference filter, which should be generated when the signal of the target frequency is inputted to the reference filter, is 90 degrees or −90 degrees. When the phase difference of the reference filter is 90 degrees or −90 degrees, a multiplication circuit can be used as the phase difference detector. Therefore, a circuit scale can be small.

The counter may include: a first input terminal which inputs the output signal of the comparator; a second input terminal which inputs the reference signal; first output terminals each of which is provided for each count value; a second output terminal which outputs a timing signal corresponding to the number of counting times; and a third output terminal which outputs a reset signal for resetting the determination circuit.

The determination circuit may include count determination units which are provided for each count values, and each of the count determination units may include: plural data flip-flop circuits having a data input terminal which inputs the signal outputted from the first output terminal provided for each count value of the counter, a clock terminal which inputs the timing signal outputted from the second output terminal of the counter, and a reset terminal which inputs the reset signal outputted from the third output terminal of the counter; plural AND circuits which input outputs of at least the two data flip-flop circuits; and an OR circuit which inputs outputs of the plural AND circuits.

The determination circuit may select the count value which is generated more than N/2 times (N is a positive integer more than 1) from N count values. When the count value satisfying the criterion is not obtained, the filter adjustment is not terminated. Thus, the selected count value is the reliable value. This enables the filter adjustment with high accuracy.

The determination circuit may select the count value which is generated most frequently from N count values (N is a positive integer more than 1). According to the criterion, even if the frequency of occurrence of the count value which is generated most is not more than N/2, the most probable value can be selected. The criterion is suitable to the case where the filter has the bad C/N characteristics and the frequency of occurrence of the most generated count value is lower than N/2.

The determination circuit may select the count value which is generated consecutively a plurality of times. The criterion is suitable to the high-speed adjustment. For example, in the case where the count value is consecutively generated twice and is selected, the adjustment can be terminated faster than any case in which another above criterion is adopted. The criterion is suitable to the case where the reference filter and other circuits are relatively stabilized.

The determination circuit may select the count value which is generated at least twice from three time counts. The criterion is suitable to the case where the filter C/N characteristics is relatively in a good level in which the adjustment can be usually terminated once, and the correct count value can be selected in the unlikely event that the counting fails.

In case that the counting is to be attempted N times (N is a positive integer more than 1), the determination circuit may terminate the counting when the determination circuit determines the count value satisfying the predetermined criterion before the number of counting times does not reach the N times. For example, in the case where determination is made using the three time (N=3) counting results, when the second time count value is equal to the first time count value, the adjustment can be terminated without waiting the third time counting result, and the first time count value is set at the most probable value. Therefore, the filter adjustment can be terminated in a short time, and the filter automatic adjustment apparatus having the low power consumption can be realized.

When the count value satisfying the predetermined criterion does not exist, the counting may be re-started from the beginning to make a determination again. Therefore, the high-reliability filter adjustment can be performed.

When the determination is made the plural times and the count value satisfying the predetermined criterion does not exist, error display may be performed or the previous count value stored in a register may be used.

The reference filter may be used as the main filter. That is, the one filter may be operated as the reference filter and as the main filter. In this case, the switches are provided to the input terminal and the output terminal of the reference filter (main filter) respectively, and the switches are changed according to the case of the normal signal process and the case of the filter adjustment. In case of the filter adjustment, the switches are connected such that the input terminal of the reference filter is connected to the frequency divider and the output terminal of the reference filter is connected to the phase difference detector. In case of the normal signal process, the switches are separated from the frequency divider and the phase difference detector, and the reference filter is used as the main filter. Therefore, it is not necessary to individually provide the reference filter and the main filter, and the filter automatic adjustment apparatus can be miniaturized. According to the configuration, the dispersion of main filter is observed by using the main filter, so that a relative dispersion between the reference filter and the main filter is eliminated.

A filter automatic adjustment method of the invention, which adjusts a characteristic frequency of a main filter to a target frequency, includes the steps of: inputting a signal of the target frequency to a reference filter; detecting a phase difference between an input signal and an output signal of the reference filter to output a phase difference detection signal having a duty ratio corresponding to the phase difference; converting the phase difference detection signal into a rectangular wave to output the rectangular wave; consecutively counting a length of a predetermined interval of the rectangular wave plural times based on a reference signal; selecting a count value satisfying a predetermined criterion from the count values of the plural times; decoding a control signal for adjusting the characteristic frequency of the main filter to the target frequency based on the selected count value; storing the control signal in a register; and adjusting the characteristic frequency of the main filter based on the control signal.

A mobile telephone system of the invention includes: a main filter which performs filtering of an input signal with a characteristic frequency to output the signal; a filter automatic adjustment apparatus described above which adjusts the characteristic frequency of the main filter to a target frequency; and a baseband processing unit which converts an output signal of the main filter into voice or data.

The filter automatic adjustment apparatus, the filter automatic adjustment method, and the mobile telephone system of the invention can adjust a filter with high accuracy and low power consumption even if the power supply has the large fluctuation or the filter has the bad C/N characteristics.

BRIEF DESCRIPTION OF THE DRAWINGS

FIG. 3A shows the case of good C/N characteristics of the reference filter, and FIG. 3B shows the case of bad C/N characteristics of the reference filter;

FIG. 4 shows count values of presence and absence of a CR product dispersion of the reference filter of the filter automatic adjustment apparatus according to the first embodiment of the invention;

FIG. 9 shows a relationship between a count value and an adjusted rate of a resistance in the first embodiment of the invention;

DETAILED DESCRIPTION OF THE PREFERRED EMBODIMENTS

Embodiments which specifically show the best mode for carrying out the invention, will be described below with reference the accompanying drawings.

First Embodiment

Figure 1:
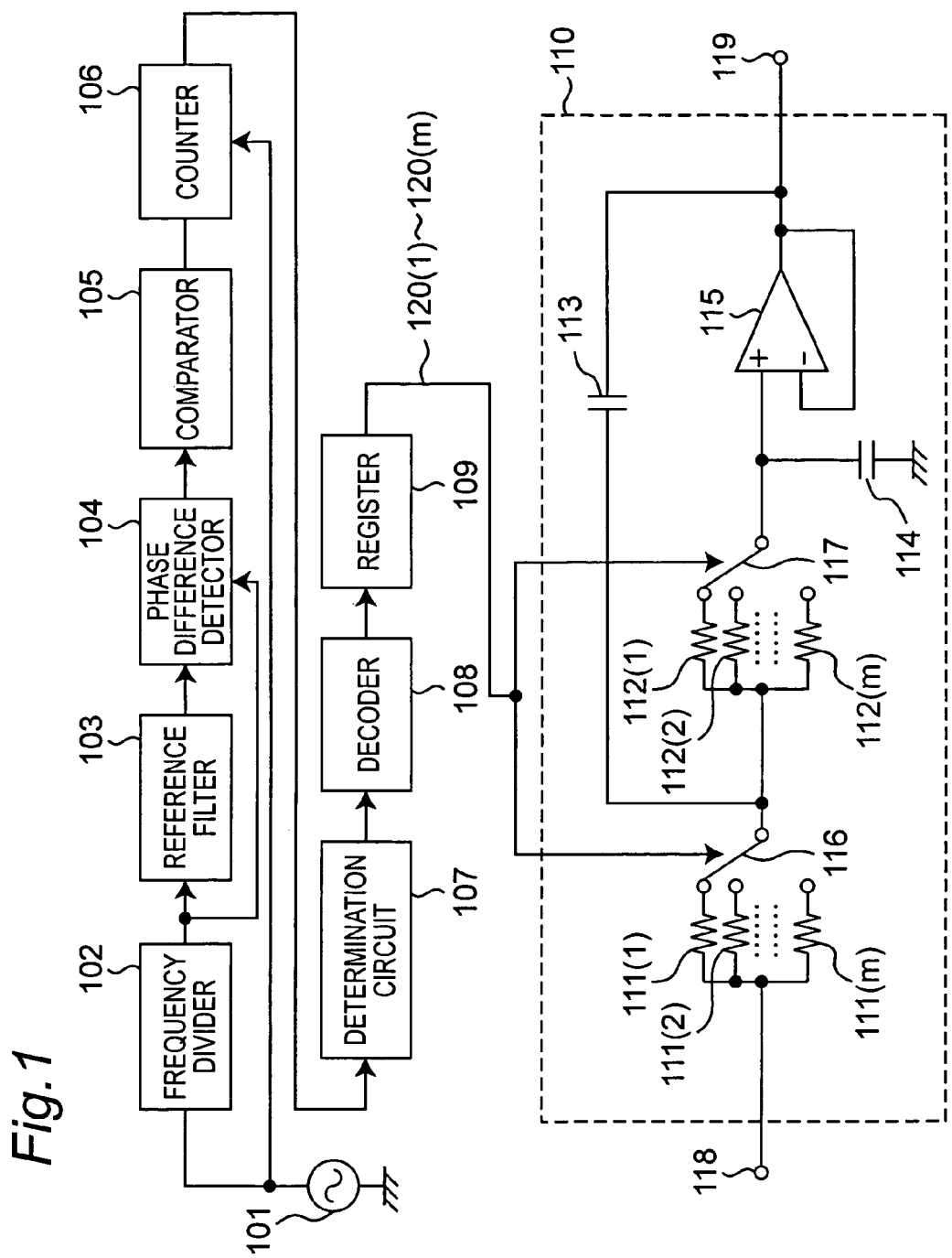
FIG. 1 is a block diagram showing a main filter and a filter automatic adjustment apparatus according to a first embodiment of the invention.

A filter automatic adjustment apparatus and a filter automatic adjustment method according to a first embodiment of the invention will be described with reference to FIGS. 1 to 9. FIG. 1 shows a main filter 110 and the filter automatic adjustment apparatus of the first embodiment which adjusts a characteristic frequency of the main filter 110 to a target frequency.

In the first embodiment, the main filter 110 is a low-pass filter (LPF). The main filter 110 includes resistors 111(1) to 111(m) (m is a positive integer more than 1) and resistors 112(1) to 112(m) which are m number of resistors connected in parallel respectively, an operational amplifier 115 which is provided so that a positive input terminal is connected to the resistors 112(1) to 112(m) and an output terminal and negative input terminal are connected to each other, a capacitor 114 which is connected between the positive input terminal of the operational amplifier 115 and a ground potential, a capacitor 113 which is connected between a connection point of the resistors 111(1) to 111(m) and the resistors 112(1) to 120(m) and the output terminal of the operational amplifier 115. The main filter 110 also includes a switch 116 which selects any one of the resistors 111(1) to 111(m) based on control signals 120(1) to 120(m) outputted from the filter automatic adjustment apparatus, and a switch 117 which selects any one of the resistors 112(1) to 112(m) based on control signals 120(1) to 120(m).

The filter automatic adjustment apparatus of the first embodiment includes a reference signal source 101 which generates a reference signal, a frequency divider 102 which divides a frequency of the reference signal to output a divided frequency signal, and a reference filter 103 which has accuracy substantially equal to that of the main filter 110.

Figure 2:
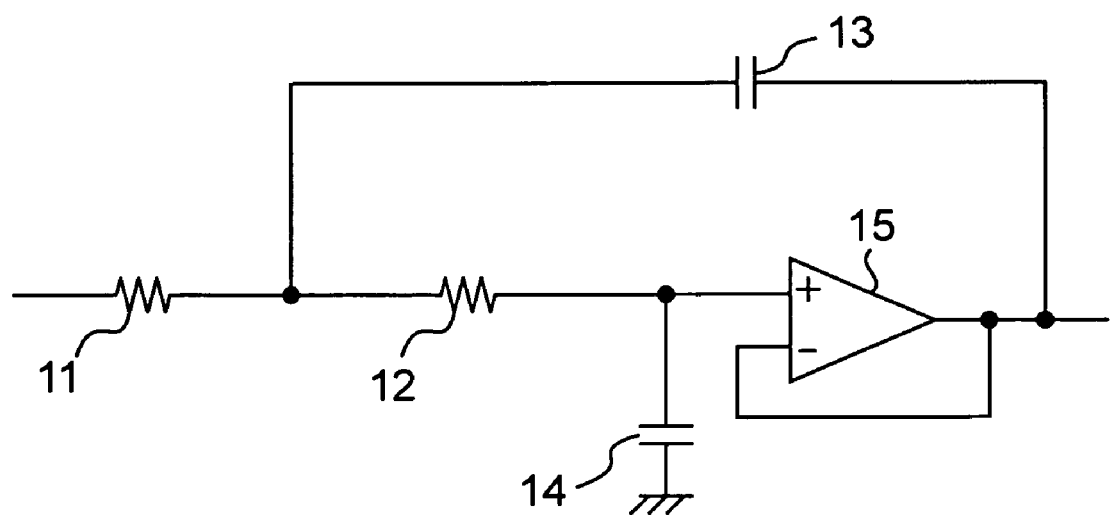
FIG. 2 is a diagram showing an internal circuit of a reference filter of the first embodiment of the invention.

The reference filter 103 is an LPF shown in FIG. 2. One end of a resistor 12 is connected to a resistor 11, and the other end of the resistor 12 is connected to the positive input terminal of an operational amplifier 15. One end of a capacitor 14 is connected to the connection point between the resistor 12 and the operational amplifier 15, and the other end is connected to the ground. The output terminal of the operational amplifier 15 is connected to the negative input terminal of the operational amplifier 15. One end of a capacitor 13 is connected to the output terminal of the operational amplifier 15, and the other end is connected to the connection point between the resistor 11 and the resistor 12.

The reference filter 103 is not for actually processing a signal, but for detecting a dispersion of an integrated circuit. As used herein, the term "dispersion" means mainly a dispersion of a resistor and a dispersion of a capacitor when producing the integrated circuit.

The frequency divider 102 creates the signal which is of the target frequency of the main filter 110, that is, a signal of the characteristic frequency without dispersion of reference filter 103 from the reference signal outputted by the reference signal source 101 at 50% duty of a signal waveform.

The reference filter 103 is designed such that a phase difference between an input waveform and an output waveform is 90° when the signal having the characteristic frequency of the reference filter 103 is inputted and the phase difference is not 90° when the resistance dispersion or the capacitance dispersion exists.

The filter automatic adjustment apparatus of the first embodiment shown in FIG. 1 also includes a phase difference detector 104 which receives the input signal and the output signal of the reference filter 103 and outputs a phase difference detection signal which has a duty ratio corresponding to the phase difference, a comparator 105 which converts the phase difference detection signal into a rectangular wave, and a counter 106 which counts an L (Low) interval of the rectangular wave based on the reference signal.

Figure 3A:
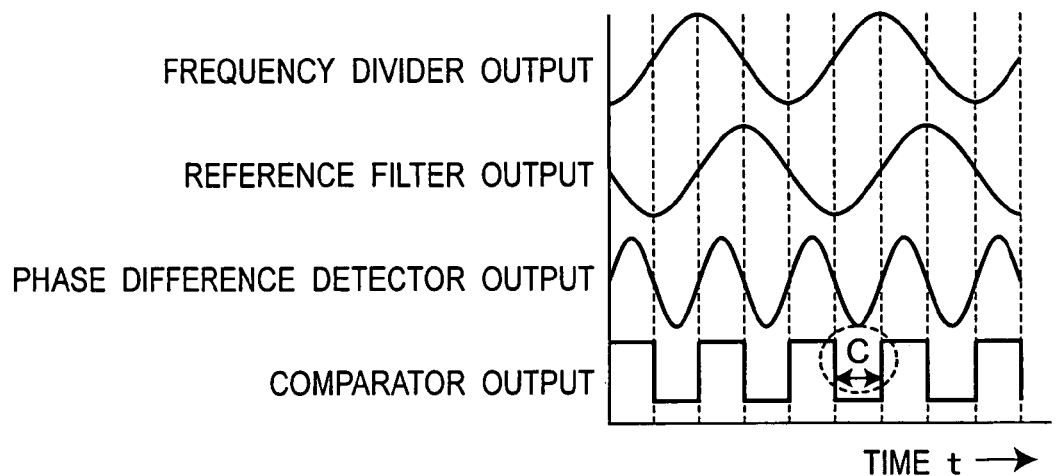
FIG. 3A and FIG. 3B are waveform diagrams of signals outputted from internal blocks of the filter automatic adjustment apparatus of the first embodiment of the invention.

FIG. 3A shows waveforms of the output signals of the frequency divider 102, reference filter 103, phase difference detector 104, and comparator 105 when the reference filter 103 has a good C/N characteristic. The divided frequency signal outputted from the frequency divider 102 is a sine wave, and the phase of the signal outputted from the reference filter 103 is delayed by 90° compared with the divided frequency signal.

In the first embodiment, the phase difference detector 104 includes a multiplication circuit. The phase difference detector 104 receives the divided frequency signal outputted from the frequency divider 102 and the output signal of the reference filter 103 to output the phase difference detection signal having the double frequency waveform of the divided frequency signal. The comparator 105 converts the phase difference detection signal into the rectangular wave.

Figure 3B:
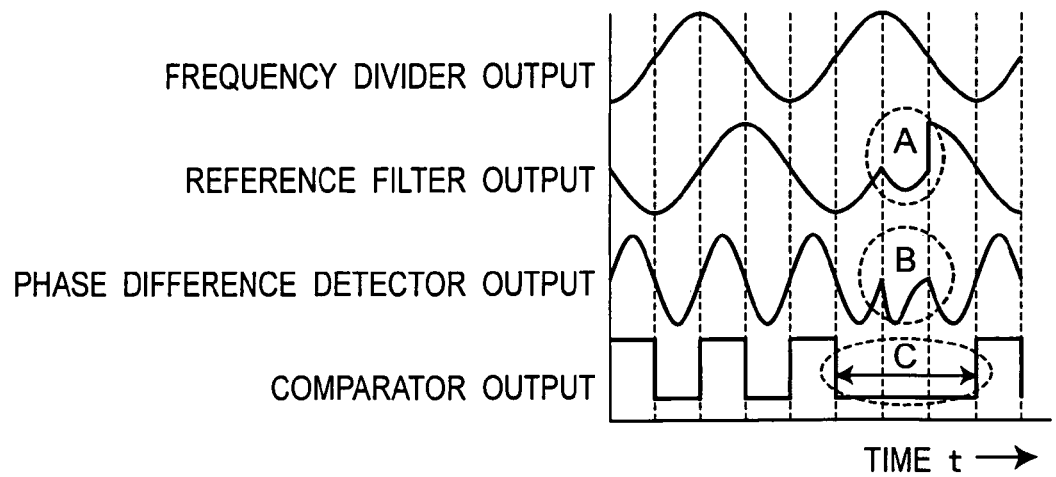

FIG. 3B illustrates the waveforms when the reference filter 103 has a bad C/N characteristic and a part of the output of the reference filter 103 is lost. As shown in a portion A of FIG. 3B, when a part of the output of the reference filter 103 is lost, the output signal waveform of the phase difference detector 104 is changed as shown in a portion B. This causes a Low interval C of the rectangular wave of the comparator 105 shown in FIG. 3B to become longer compared with the Low interval C shown in FIG. 3A.

FIG. 4 shows a result in which the counter 106 counts the rectangular wave outputted from the comparator 105 by using the reference signal of the reference signal source 101. The counter 106 counts the L interval of the rectangular wave outputted from the comparator 105 at a rise edge of the reference signal. A count value outputted from the counter 106 is eight counts when the dispersion of reference filter 103 does not exist (the CR product=±0%). On the other hand, when the CR product of the reference filter 103 varies, the output phase of the reference filter 103 is shifted from 90° compared with the input waveform of the reference filter 103, as a result, the duty ratio output of the comparator 105 changes. Therefore, when the dispersion of reference filter 103 exists (the CR product=−26%), the count value is ten counts. Since the dispersion of reference filter 103 is substantially equal to the dispersion of main filter 110, the characteristic frequency of the main filter 110 is adjusted by observing the dispersion of reference filter 103.

As shown in FIG. 3B, when the output of the comparator 105 is incorrect, the counter 106 outputs the false count value. The filter automatic adjustment apparatus of the first embodiment shown in FIG. 1 includes a determination circuit 107 which selects the most probable count value from the plural time outputs of the counter 106 in order to accurately adjust the main filter 110, even if the counter 106 outputs the false count value. In the first embodiment, the determination circuit 107 selects the most probable count value from the three time counts outputted from the counter 106.

Figure 5:
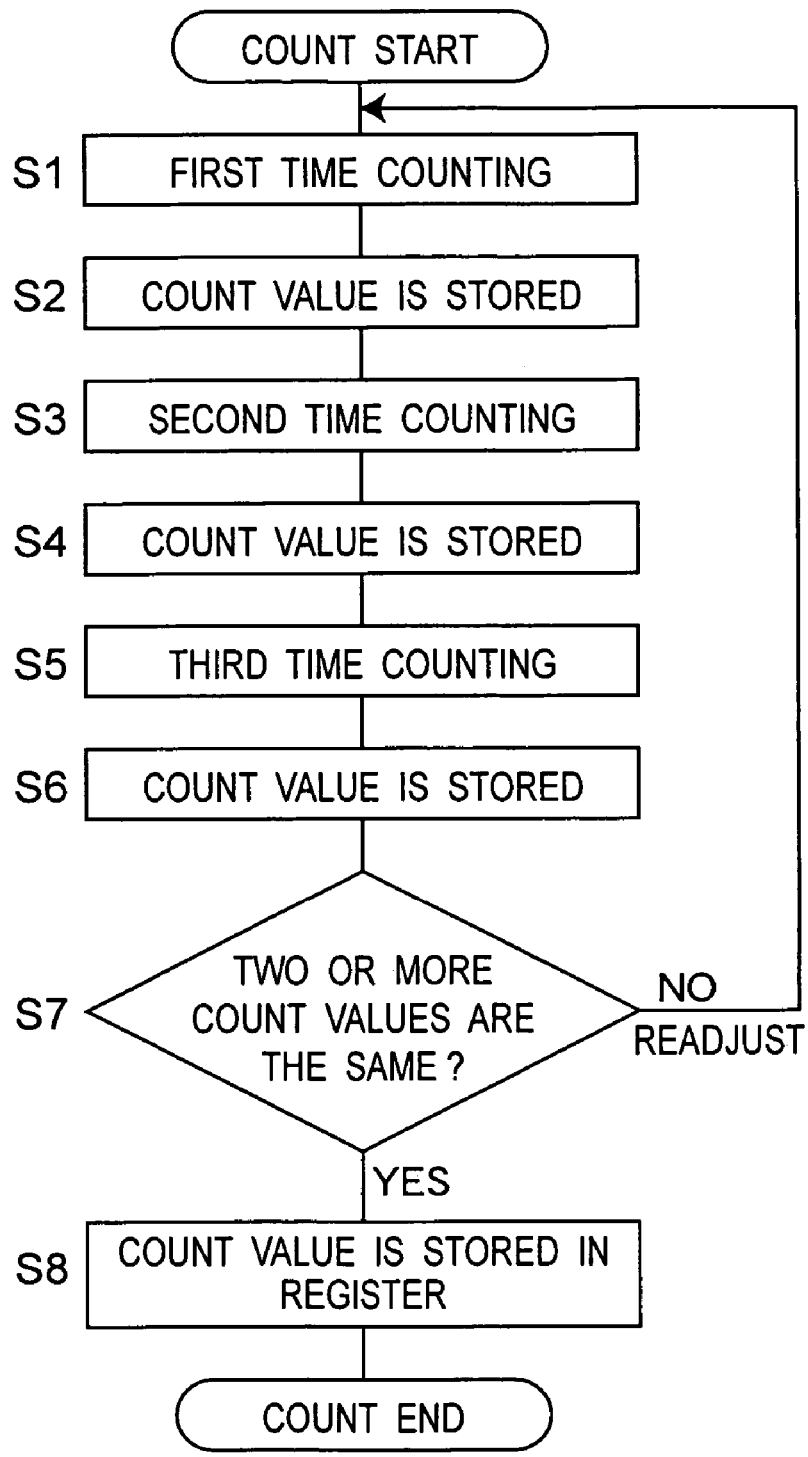
FIG. 5 is a flowchart showing a filter automatic adjustment method of the first embodiment of the invention.

FIG. 5 shows the filter automatic adjustment method of the first embodiment. FIG. 5 is a view for explaining an operation flow when the most probable count value is selected from the three time counts. The first time counting is performed (S1), and the count value is stored (S2). The second time counting is performed (S3), and the count value is stored (S4). The third time counting is performed (S5), and the count value is stored (S6). It is determined whether or not two or more count values are the same in the three count values (S7). When at least two count values are the same (Yes at S7), the count value is stored in a register as a solution (S8), and the counting is ended. When the three different count values are obtained (No at S7), the counting is restarted from the first time.

Figure 6:
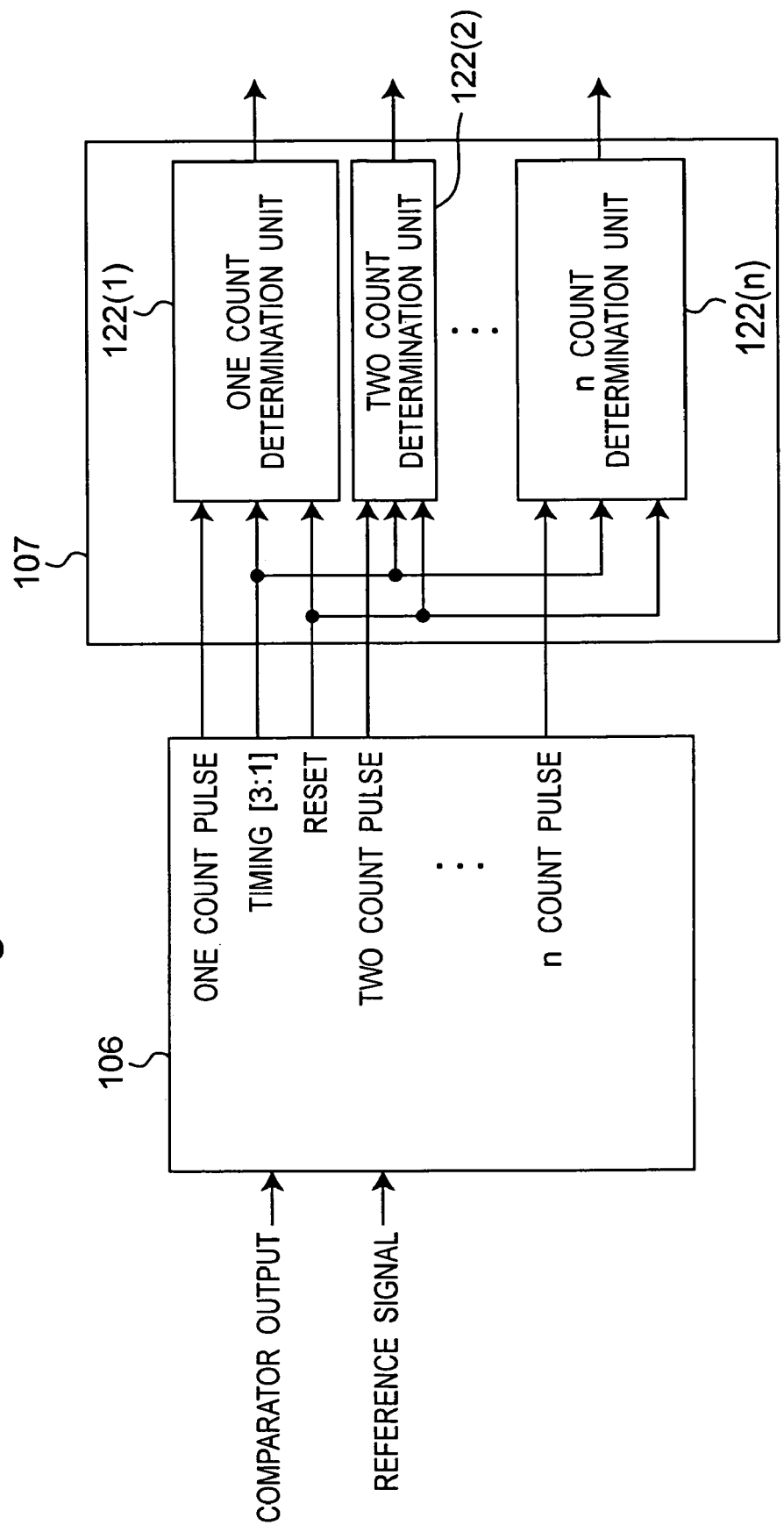
FIG. 6 specifically shows connection between a counter and a determination circuit of the first embodiment of the invention.

The counter 106 and the determination circuit 107 which realize the above filter automatic adjustment method will be described with reference to FIGS. 6 and 7. FIG. 6 shows a connection relationship between the counter 106 and the determination circuit 107. The counter 106 includes a first input terminal which receives the rectangular wave outputted from the comparator 105, and a second input terminal which receives the reference signal outputted from the reference signal source 101. The counter 106 also includes n (n is a positive integer more than 1) first output terminals each of which is provided for each count value. For example, when the count value is k (1≦k≦n) counts, the counter 106 outputs an H (High) signal from the k count pulse output terminal.

The counter 106 further includes a second output terminal which outputs a timing signal corresponding to the count time, and a reset terminal which outputs a reset signal for resetting the determination circuit 107 and is a third output terminal. The timing signal is outputted at timing shown in FIG. 7. That is, the timing 1, 2, and 3 signals which indicate the first time, second time, and third time counts are respectively outputted at times t1, t2, and t3 in the H (High) interval of the rectangular wave outputted from the comparator 105. Then, the counter 106 outputs the reset signal before it outputs the next timing 1 signal.

The determination circuit 107 includes count determination units 122(1) to 122(n) (n is a positive integer more than 1) each of which is provided for each count value. As used herein, "the count determination units 122(1) to 122(n)" is a collective term for referring to all count determinations which includes from one count determination unit 122(1) to n count determination unit 122(n); while "the count determination units" is individually referred to as "one count determination unit 122(1)", . . . , "n count determination unit 122(n)".

The counter 106 outputs "H" from the first output terminal corresponding to the count result. For example, when the count value is one, the counter 106 outputs "H" from the first output terminal for one count pulse. The H signal outputted from the first output terminal for one count pulse of the counter 106 is inputted only to the one count determination unit 122(1). Similarly the H signal outputted from the first output terminal for k (1≦k≦n) count pulse of the counter 106 is inputted only to the k count determination unit 122(k). The timing signals and reset signal outputted from the counter 106 are inputted to all of the count determination units 122(1) to 122(n).

Figure 8:
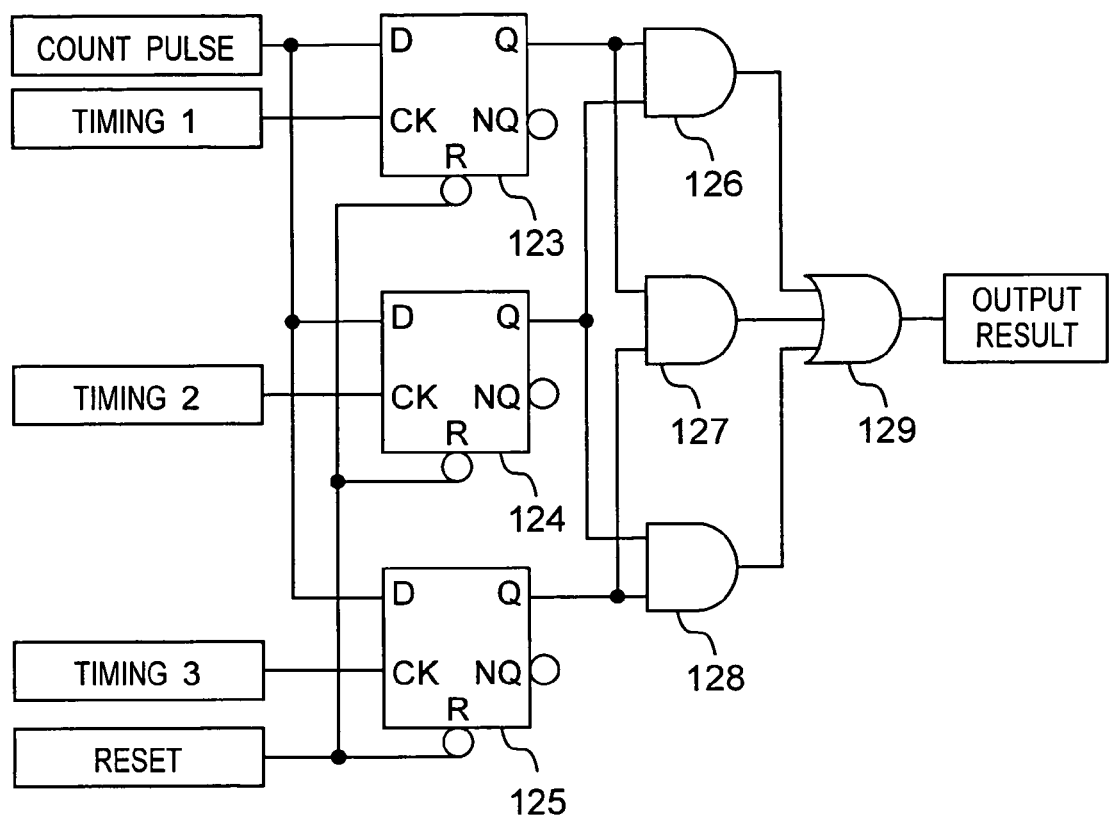
FIG. 8 is a circuit diagram showing a count determination unit of the first embodiment of the invention.

FIG. 8 shows an internal circuit of the count determination units 122(1) to 122(n). Each of the count determination units 122(1) to 122(n) includes data flip-flop circuits 123, 124, and 125, AND circuits 126, 127, and 128, and an OR circuit 129. The H signal outputted from the counter 106 is inputted to data input terminals D of the data flip-flop circuits 123, 124, and 125. The signal of the timing 1 is inputted to a clock terminal CK of the data flip-flop circuit 123, the signal of the timing 2 is inputted to a clock terminal CK of the data flip-flop circuit 124, and the signal of the timing 3 is inputted to a clock terminal CK of the data flip-flop circuit 125. The reset signal outputted from the counter 106 is inputted to reset terminals R of the data flip-flop circuits 123, 124, and 125. The outputs of the data flip-flop circuits 123 and 124 are inputted to the AND circuit 126, the outputs of the data flip-flop circuits 123 and 125 are inputted to the AND circuit 127, and the outputs of the data flip-flop circuits 124 and 125 are inputted to the AND circuit 128. Input terminals of the OR circuit 120 are connected to output terminals of the AND circuits 126, 127, and 128, and the output of the OR circuit 120 is the output of the count determination units 122(1) to 122(n).

The count determination unit 122(1) to 122(n) having the above configuration outputs the H signal when at least the two H signals are inputted in the three time inputs.

Figure 7:
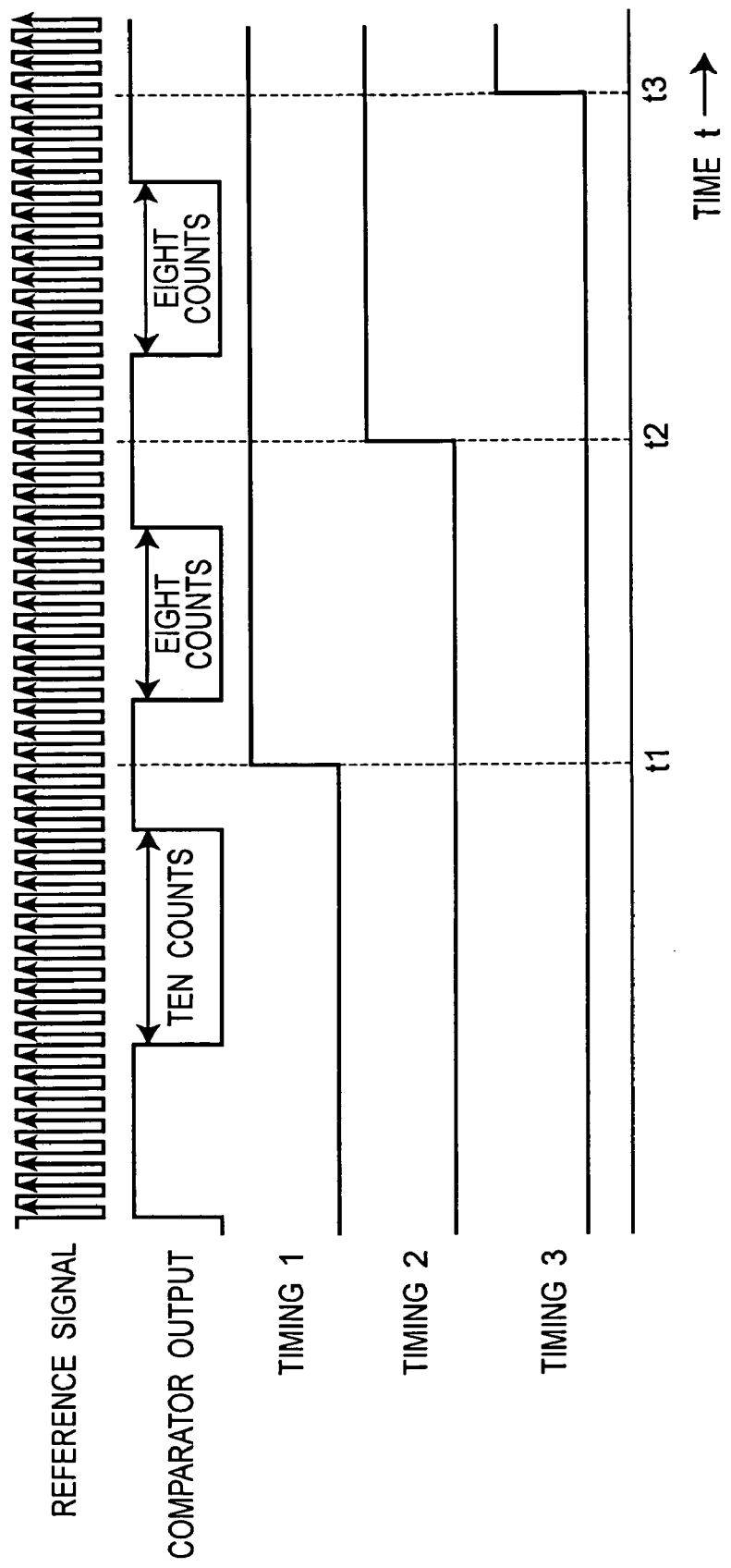
FIG. 7 shows timing of a timing signal transmitted from the counter to the determination circuit according to the first embodiment of the invention.

As shown in FIG. 7, the case where the count value is ten counts, eight counts, and eight counts as a result three time counts during the L intervals of the output signal of the comparator 105 will be described below.

Since the first time count value is the ten counts, the counter 106 outputs the H signal to the ten count determination unit 122(10). The H signal is inputted to the data input terminals D of the data flip-flop circuits 123, 124, and 125 of the ten count determination unit 122(10). When the counter 106 outputs the signal of the timing 1 at the time t1, the signal of the timing 1 is inputted to the clock terminal CK of the data flip-flop circuit 123 of the ten count determination unit 122(10). Therefore, the data flip-flop circuit 123 outputs the H signal from an output terminal Q.

Since the second time count value is the eight counts, the counter 106 outputs the H signal to the eight count determination unit 122(8). The H signal is inputted to the data input terminals D of the data flip-flop circuits 123, 124, and 125 of the eight count determination unit 122(8). When the counter 106 outputs the signal of the timing 2 at the time t2, the signal of the timing 2 is inputted to the clock terminal CK of the data flip-flop circuit 124 of the eight count determination unit 122(8). Therefore, the data flip-flop circuit 124 outputs the H signal from an output terminal Q.

Since the third time count value is the eight counts, the counter 106 outputs the H signal to the eight count determination unit 122(8). The H signal is inputted to the data input terminals D of the data flip-flop circuits 123, 124, and 125 of the eight count determination unit 122(8). When the counter 106 outputs the signal of the timing 3 at the time t3, the signal of the timing 3 is inputted to the clock terminal CK of the data flip-flop circuit 125 of the eight count determination unit 122(8). Therefore, the data flip-flop circuit 125 outputs the H signal from an output terminal Q.

In the eight count determination unit 122(8), the AND circuit 128 receives the H signals from the data flip-flop circuits 124 and 125 to output the H signal. Therefore, the OR circuit 129 outputs the H signal.

Thus, each of the count determination units 122(1) to 122(n) outputs the H signal when at least two H signals are inputted. That is, the determination circuit 107 selects the eight counts which are counted twice as the most probable count value from the three time count results performed by the counter 106 and determines that the ten counts are an error due to some sort of influence.

The filter automatic adjustment apparatus of the first embodiment shown in FIG. 1 also includes a decoder 108 and a register 109. The count value selected by the determination circuit 107 (that is, the H signal outputted from any one of the count determination units 122(1) to 122(m)) is inputted to the decoder 108. The decoder 108 generates the control signals 120(1) to 120(m) for adjusting the characteristic frequency of the main filter 110 based on the count value selected by the determination circuit 107. In the first embodiment, each of the control signals 120(1) to 120(m) is a signal which selects any one of the resistors 111(1) to 111(m) of the main filter 110 and any one of the resistors 112(1) to 112(m) of the main filter 110.

The register 109 stores the control signals 120(1) to 120(m) outputted from the decoder 108. After the main filter 110 is adjusted once, blocks (the frequency divider 102, the reference filter 103, the phase difference detector 104, the comparator 105, the counter 106, the determination circuit 107, and the decoder 108) except for the register 109 of the filter automatic adjustment apparatus can be turned off by storing the control signals 120(1) to 120(m) in the register 109. Therefore, the filter automatic adjustment apparatus of the first embodiment realizes the low power consumption.

The filter automatic adjustment apparatus selects anyone of the resistors 111(1) to 111(m) and any one of the resistors 112(1) to 112(m) by switching the switch 116 and the switch 117 of the main filter 110 based on the control signals 120(1) to 120(m) stored in the resistor 109. Therefore, the resistance of the resistor 109 in the main filter 110 is adjusted.

FIG. 9 shows an example of a relationship among the dispersion of the CR product of the reference filter 103, the phase difference of the reference filter 103, the count value, an adjusted rate of a resistance of the main filter 110, and the apparent dispersion of the adjusted CR product of the main filter 110. As can be seen from FIG. 9, for example, in case that the determination circuit 107 selects the eight counts, the dispersion of the CR product of the reference filter 103 ranges from 0% to −13%. Thus, the decoder 108 can generate the control signals 120(1) to 120(m) for setting the resistance of the main filter 110 to 1.070 times the normal design. Therefore, the apparent dispersion of the CR product of the main filter 110 can be set in the range of 7.0% to −7.0%, and the characteristic frequency of the main filter 110 is adjusted to the characteristic frequency having no dispersion.

Thus, according to the filter automatic adjustment apparatus and filter automatic adjustment method of the first embodiment, even if the reference filter 103 has the bad C/N characteristic, the low power consumption can be realized while the main filter 110 can be adjusted with high accuracy.

In the first embodiment, although the reference signal frequency of the reference signal source 101 is divided by the frequency divider 102, the frequency divider 102 may not be provided because it is not necessary to divide the frequency when the reference signal outputted from the reference signal source 101 is the characteristic frequency signal having no dispersion of reference filter 103.

In the first embodiment, although the phase difference between the input signal and the output signal of the reference filter 103 is 90° when having no dispersion, the value is not limited to 90° and any value may be taken if the correlation between the CR product dispersion and the phase is provided.

Although the multiplication circuit is used as the phase difference detector 104, another circuit may be used as the phase difference detector 104 as long as the circuit can determine the phase difference between the input signal and the output signal of the reference filter 103.

As described above, since the filter automatic adjustment apparatus disclosed in Patent Document 1 is always operated, the reference filter is necessary independently of the main filter which performs the signal processing. On the contrary, since the invention includes the register 109, the reference filter 103 is used only when adjusting the filter. Therefore, the reference filter 103 may not be used, but main filter 110 in itself may be used as the reference filter 103. That is, the one filter may be operated as the reference filter and as the main filter. In this case, a switch connected to the input terminal 118 and a switch connected to the output terminal 119 of the main filter 110 are provided. The switches are connected to the frequency divider 102 and the phase difference detector 104 such that, in case of the filter adjustment, the divided frequency signal of the frequency divider 103 is inputted to the input terminal 118 of the main filter 110 and the signal outputted from the output terminal 119 of the main filter 110 is inputted to the phase difference detector 104. When the filter adjustment is terminated, the switch is switched off from the filter automatic adjustment apparatus, and the main filter 110 is used for the signal processing. Since the reference filter 103 is not provided, the further miniaturization can be achieved. There is also a merit that a relative dispersion does not exist between the reference filter 103 and the main filter 110.

In the first embodiment, although the reference filter 103 and the main filter 110 are LPF, they are not limited to LPF, and the reference filter 103 and the main filter 110 may be another active filter which uses the operational amplifier. The reference filter 103 and the main filter 110 may also be a gm-C filter including plural transconductance amplifiers and plural capacitors.

In the first embodiment, although the counting is re-started from the first time when at least the two same count values are not outputted from the three count results in S7 of FIG. 5, the filter adjustment may be terminated without re-starting the counting, and error display may be performed. The main filter 110 may also be adjusted by using the control signals 120(1) to 120($m$) of the previous results stored in the register 109. In S7 of FIG. 8, when the three count values are different from one another, the counting is re-attempted predetermined times, and when the count value cannot still be determined, error end may be performed.

Second Embodiment

Figure 10:
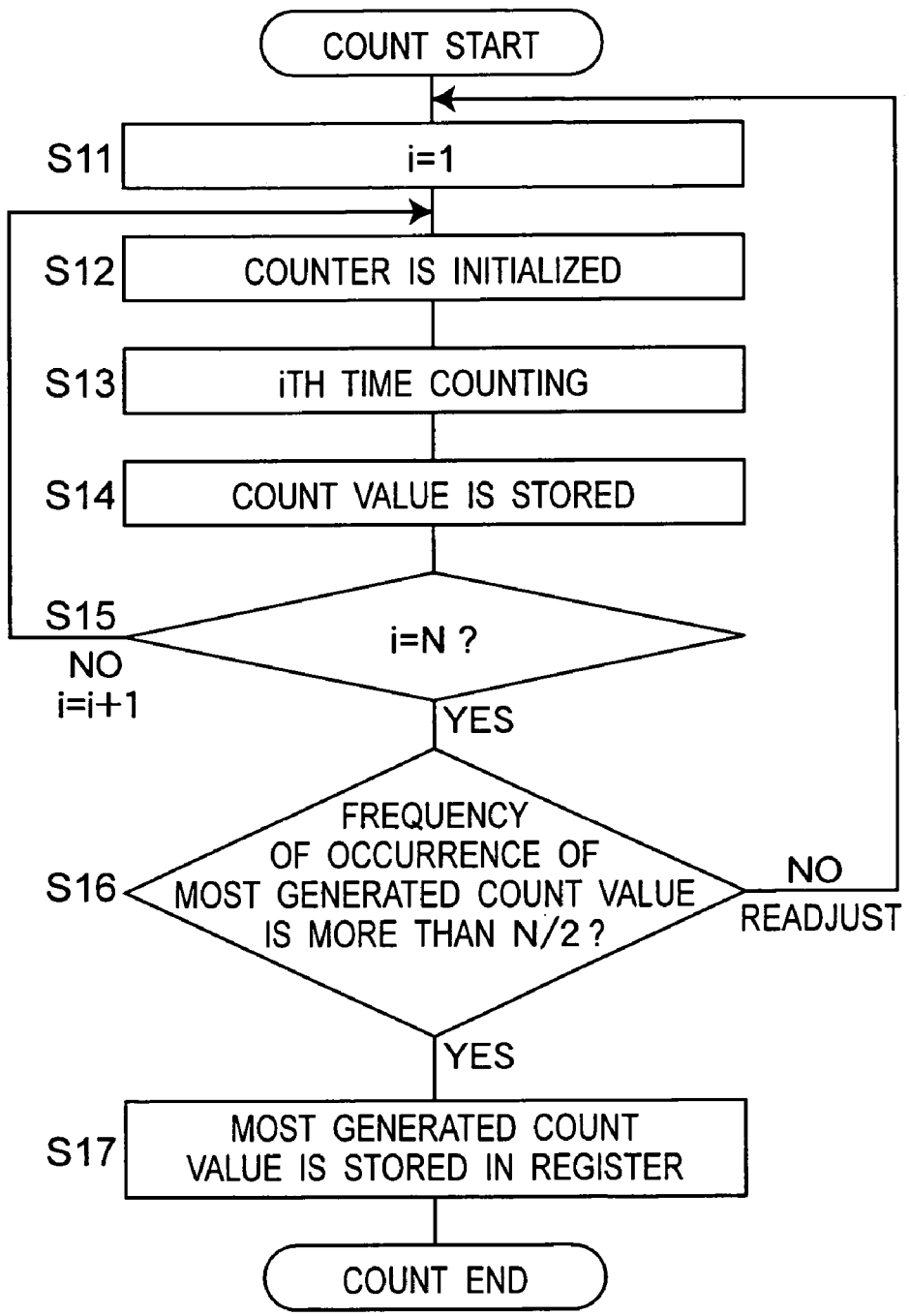
FIG. 10 is a flowchart showing a filter automatic adjustment method according to a second embodiment of the invention.

A filter automatic adjustment method according to a second embodiment of the invention will be described with reference to FIG. 10. FIG. 10 shows the filter automatic adjustment method of the second embodiment. FIG. 10 is a diagram for explaining a flow of the method of selecting the count value satisfying a criterion of the second embodiment from N (N is 4 or more) time counting results. The configuration of the filter automatic adjustment apparatus of the second embodiment is similar to the filter automatic adjustment apparatus of the first embodiment shown in FIG. 1.

A current count time i is set at 1 (S11), and the counter 106 is initialized (S12). The ith time counting is performed by the counter 106 (S13), and the count value is stored (S14). It is determined whether or not the current count time i reaches the number of count times N necessary to one time determination (S15). When the current count time i does not reach the number of count times N (No at S15), the flow returns to S12, and the (i+1)th time counting is performed. When the current count time i reaches the number of count times N (Yes at S15), it is determined from the N count values whether or not a frequency of occurrence of a count value which is generated most is more than N/2 (S16). When the frequency of occurrence of the most generated count value is more than N/2 (Yes at S16), the most generated count value is selected and stored in the register (S17), and the determination process is ended. When the frequency of occurrence of the most generated count value is not more than N/2 (No at S16), the counting is re-started from the first time counting (S11).

When the criterion of the second embodiment is used, similarly to the first embodiment, the filter can be adjusted with high accuracy.

In the criterion of S16, the condition of the frequency of occurrence of the count value which is generated most is not limited to N/2, but other numbers may be at the condition. The count value which is generated most frequently may be selected regardless of the frequency of occurrence. However, for example, in the case where the counting results are unequal such that the six counts are once, the seven counts are once, the eight counts are once, and the ten counts are twice, it is desirable that the error end be performed as adjustment failure without selecting the ten counts which are generated twice. Therefore, the condition of the frequency of occurrence of the most generated count value is preferably set to predetermined times or greater.

In the case where the one time determination is made by the N counting times, sometimes the count value of the solution is determined in the middle of counting without waiting the Nth counting result. In this case, the solution may be determined to adjust the filter without performing the counting to the end. Thus, the filter adjustment can be performed at higher speed with low power consumption.

The count value which is generated continuously equal to or more than predetermined times may be selected. At this point, when the L interval of the output of the comparator 105 is just located between the count values of eight and nine, that is, when the L interval is terminated before or after the ninth time counting is started, there is a fear that the same count value is not consecutively obtained twice or more such that the count values are 8, 9, 8, and 9. In this case, an algorithm which determines whether or not the L interval is terminated before the ninth time counting is started, is required.

Furthermore, instead of the criterion of S16, an average value of the N time count values may be computed by an adder.

Furthermore, some of the criteria described in the first and second embodiments may be combined. For example, at first the one time determination is made by the three time counting results, and the adjustment is terminated if at least the two same count values exist. If the count values are different from one another in three time counting results, the determination is made by performing the counting three times again. If the count values are still different from one another, the counting is attempted N times (for example, five times). When the frequency of occurrence of a count value which is generated most is more than N/2 (in this case, at least three times), the filter adjustment is terminated. When the frequency of occurrence of the count value which is generated most is not more than N12, the counting is performed N times again, and the count value which is generated most frequently is set as the solution. Thus, even in the same algorithm, the filter adjustment is terminated at high speed by combining the plural criteria when the accuracy of the filter automatic adjustment apparatus is good. In the case where the accuracy of the filter automatic adjustment apparatus is not so good, the time-consuming filter adjustment can be performed as accurately as possible.

Third Embodiment

Figure 11:
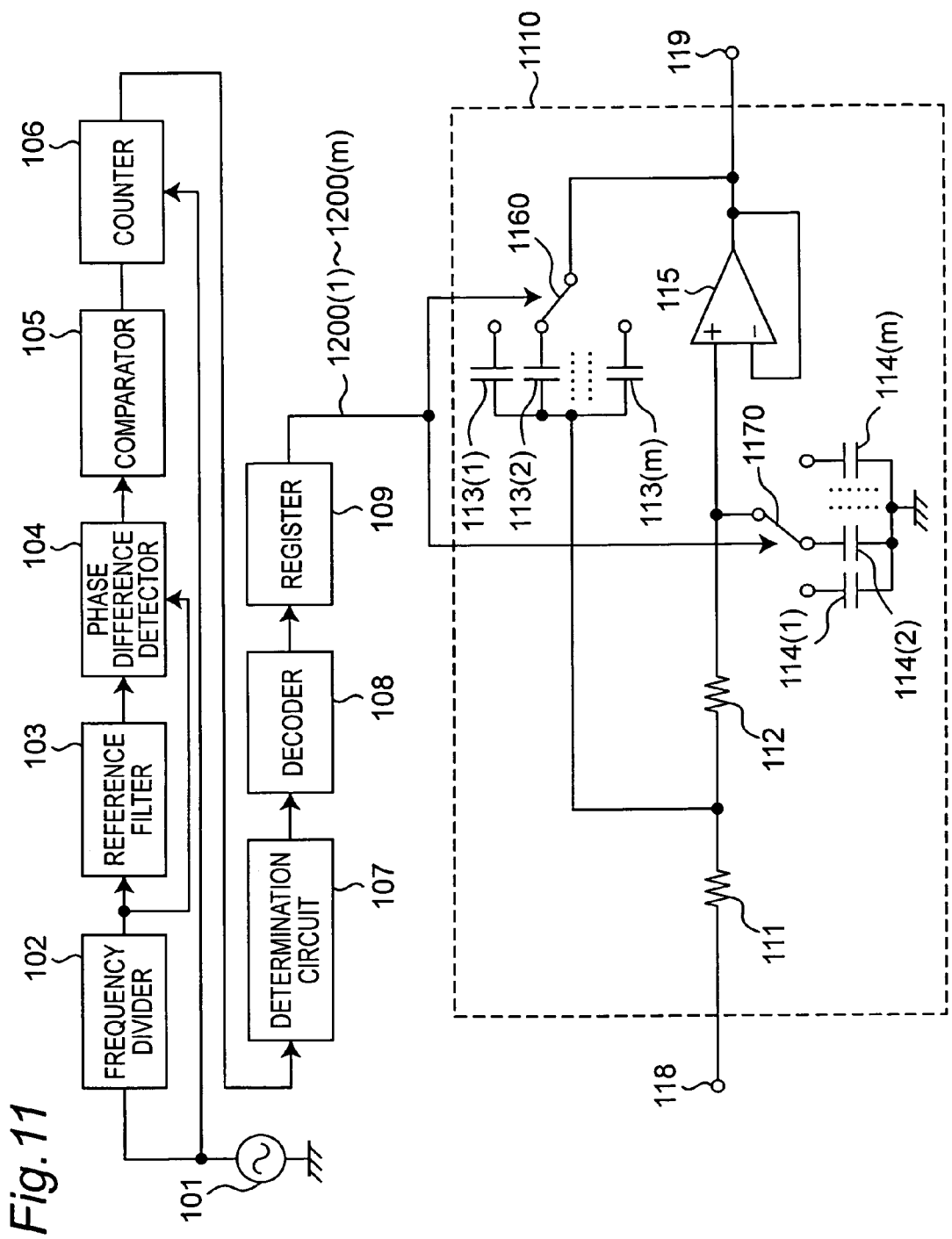
FIG. 11 is a block diagram showing a main filter and a filter automatic adjustment apparatus according to a third embodiment of the invention.

A filter automatic adjustment apparatus according to a third embodiment of the invention will be described with reference to FIG. 11. FIG. 11 shows a main filter 1110 and the filter automatic adjustment apparatus of the third embodiment. Internal configurations of the main filter 1110 of the third embodiment are different from that of the first embodiment. The main filter 1110 of the third embodiment includes m (m is a positive integer more than 1) capacitors 113(1) to 113($m$) connected in parallel and m capacitors 114(1) to 114(*m*) connected in parallel. Any one of the capacitors 113 (1) to 113(*m*) and any one of the capacitors 114(1) to 114(*m*) are selected by switching a switch 1160 and a switch 1170 based on control signals 1200(1) to 1200(*m*) of the filter automatic adjustment apparatus.

In the capacitors 113(1) to 113(*m*), one end is connected to the connection point between the resistors 111 and 112, and the other end is connected to the output terminal of the operational amplifier 115 through the switch 1160. In the capacitors 114(1) to 114(*m*), one end is connected between the resistor 112 and the positive input terminal of the operational amplifier 115 through the switch 1170, and the other end is connected to the ground. The one resistor 111 and the one resistor 112 are provided in the main filter 1110 of the third embodiment.

The configuration of the filter automatic adjustment apparatus of the third embodiment is similar to that of the first embodiment while the decoder 108 of the third embodiment generates the control signals 1200(1) to 1200(*m*) for selecting any one of the capacitors 113(1) to 113(*m*) and any one of the capacitors 114(1) to 114(*m*) based on the count value selected by the determination circuit 107. The capacitance of the main filter 1110 is adjusted according to the control signals 1200(1) to 1200(*m*).

According to the third embodiment, the same effect as the first embodiment is obtained.

The resistors 111(1) to 111(*m*) and resistor 112(1) to 112 (*m*) of the first embodiment and the capacitors 113(1) to 113(*m*) and capacitors 114(1) to 114(*m*) of the third embodiment may be provided in the main filter to switch both the resistors and capacitors according to the control signal of the filter automatic adjustment apparatus.

Fourth Embodiment

Figure 12:
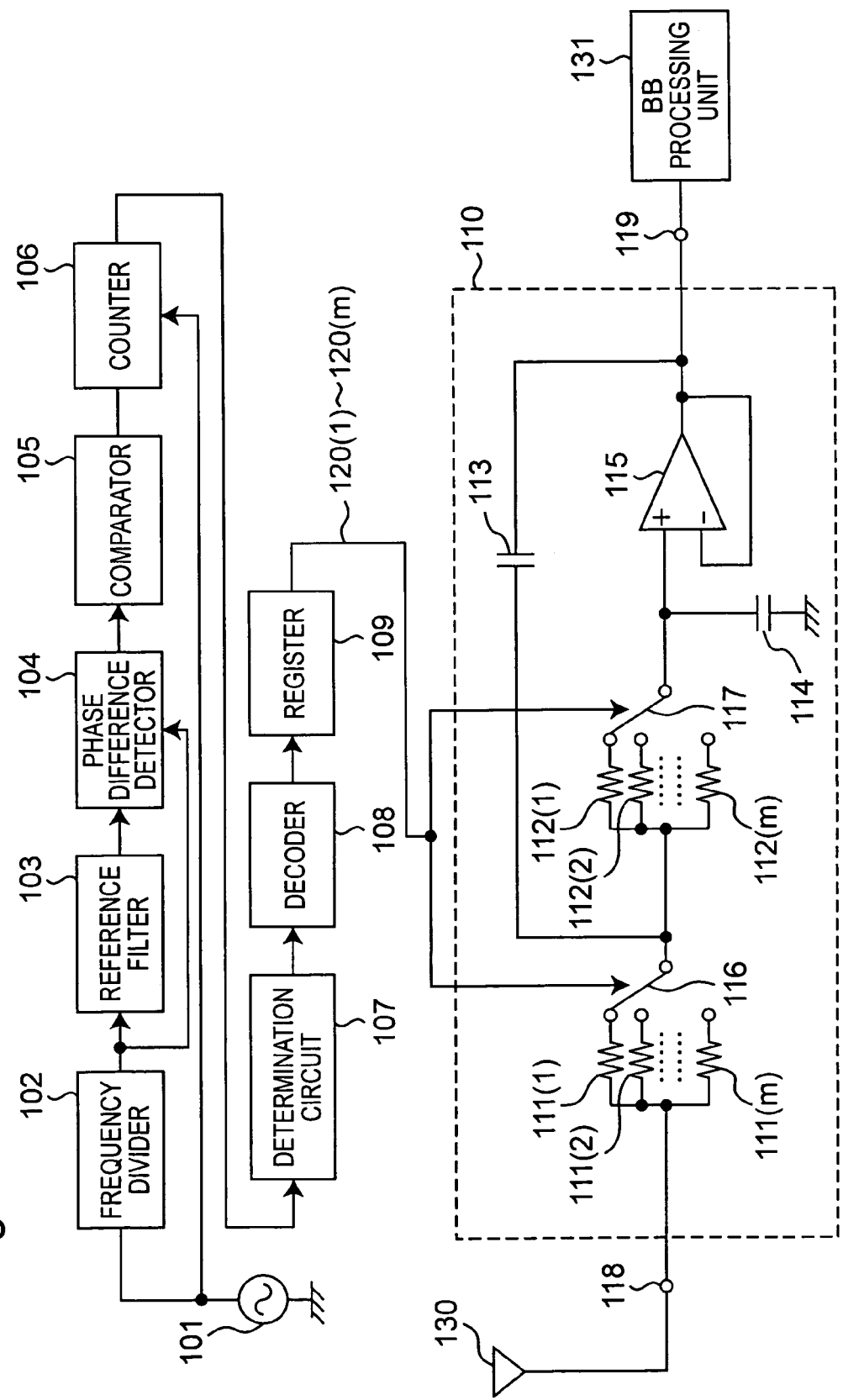
FIG. 12 is a block diagram showing a mobile telephone system according to a fourth embodiment of the invention.

A mobile telephone system according to the invention which has one of filter automatic adjustment apparatus of the above embodiments will be described. FIG. 12 shows a configuration of the mobile telephone system of the embodiment. In FIG. 12, the same elements as that of FIG. 1 are designated by the same numeral. In addition to the filter automatic adjustment apparatus and main filter 110 of the first embodiment, the mobile telephone system of the embodiment includes an antenna 130 and a baseband (BB) processing unit 131.

The mobile telephone system of the embodiment is incorporated into a mobile telephone. When the mobile telephone is powered on, the filter automatic adjustment apparatus performs the filter adjustment of the main filter 110. Then, the signal inputted to the antenna 130 is inputted to the main filter 110 which is adjusted by the filter automatic adjustment apparatus. The main filter 110 performs filtering of the inputted signal to remove an interfering wave having the different frequency from the characteristic frequency. The baseband processing unit 131 receives the signal without the interfering wave, converts the signal into voice or data, and outputs them.

Since the filter automatic adjustment apparatus of the first embodiment is low power consumption, even if the filter automatic adjustment apparatus of the first embodiment is incorporated into the mobile telephone like the present embodiment, long talk time can be secured on a one time battery charge. Further, since the large size battery is not required, the mobile telephone can be miniaturized.

Although the mobile telephone system of the present embodiment includes the main filter 110 of the first embodiment, the mobile telephone system of the embodiment may include the main filter 110 of the third embodiment, or the mobile telephone system of the present embodiment may include both the resistors 111(1) to 111(*m*) and resistors 112 (1) to 112(*m*) of the first embodiment and the capacitors 113(1) to 113(*m*) and capacitors 114(1) to 114(*m*) of the third embodiment. As the criteria of the count value used in the determination circuit 107, either the determination method of the first embodiment or the determination method of the third embodiment may be used.

The present invention is useful to the filter automatic adjustment apparatus and the filter automatic adjustment method which adjust the characteristic frequency of the filter having the adjustment function to the target frequency. Particularly the invention is applied to applications such as the mobile telephone system which requires the accurate filter adjustment and the low power consumption.

Although the present invention has been described in connection with specified embodiments thereof, many other modifications, corrections and applications are apparent to those skilled in the art. Therefore, the present invention is not limited by the disclosure provided herein but limited only to the scope of the appended claims. The present disclosure relates to subject matter contained in Japanese Patent Application No. 2005-101154, filed on Mar. 31, 2005, which is expressly incorporated herein by reference in its entirety.

What is claimed is:

1. A filter automatic adjustment apparatus, which adjusts a characteristic frequency of a main filter to a target frequency, comprising:
   a reference filter;
   a measuring section that consecutively measures a characteristic frequency of the reference filter a plurality of times; and
   a determination circuit that determines the characteristic frequency of the reference filter based on measurement results of the measuring section;
   wherein the measuring section comprises:
   a phase difference detector which detects a phase difference between an input signal and an output of the reference filter to output a signal having a duty ratio corresponding to the phase difference;
   a comparator which converts the output signal of the phase difference detector into a rectangular wave to output the rectangular wave; and
   a counter which consecutively counts a predetermined interval of an output signal of the comparator a plurality of times based on a reference signal,
   wherein the determination circuit selects a count value satisfying a predetermined criterion from a plurality of count values outputted from the counter, and
   wherein the characteristic frequency of the main filter is adjusted according to a determination result of the determination circuit.

2. The filter automatic adjustment apparatus according to claim 1, further comprising:
   a decoder which decodes a control signal for adjusting the characteristic frequency of the main filter to the target frequency based on an output signal of the determination circuit; and
   a register which stores the control signal outputted from the decoder.

3. The filter automatic adjustment apparatus according to claim 1, further comprising:
   a reference signal source which generates the reference signal outputted to the counter; and
   a frequency divider which creates a signal of the target frequency by dividing a frequency of the reference signal to output the signal of the target frequency to the reference filter.

4. The filter automatic adjustment apparatus according to claim 1, wherein the phase difference of the reference filter is 90 degrees or −90 degrees when the reference filter receives a signal of the target frequency.

5. The filter automatic adjustment apparatus according to claim 1, wherein the counter comprises:
- a first input terminal which inputs the output signal of the comparator;
- a second input terminal which inputs the reference signal;
- first output terminals, each of which is provided for a respective one of the count values;
- a second output terminal which outputs a timing signal corresponding to a number of counting times; and
- a third output terminal which outputs a reset signal for resetting the determination circuit.

6. The filter automatic adjustment apparatus according to claim 5, wherein the determination circuit comprises count determination units each of which is provided for a respective one of the count values, and each of the count determination units comprises:
- a plurality of data flip-flop circuits each having a data input terminal, a clock terminal, and a reset terminal, the data input terminals inputting a signal outputted from a respective one of the first output terminals of the counter, each of the clock terminals inputting the timing signal outputted from the second output terminal of the counter, the reset terminals inputting the reset signal outputted from the third output terminal of the counter;
- a plurality of AND circuits which input outputs of the data flip-flop circuits; and
- an OR circuit which inputs outputs of the plurality of AND circuits.

7. The filter automatic adjustment apparatus according to claim 1, wherein the determination circuit selects the count value which is generated more than N/2 times, N being a positive integer greater than 1, from N count values.

8. The filter automatic adjustment apparatus according to claim 1, wherein the determination circuit selects the count value which is generated most frequently from N count values, N being a positive integer greater than 1.

9. The filter automatic adjustment apparatus according to claim 1, wherein the determination circuit selects the count value which is generated consecutively a plurality of times.

10. The filter automatic adjustment apparatus according to claim 1, wherein the determination circuit selects the count value which is generated at least twice from three time counts.

11. The filter automatic adjustment apparatus according to claim 1, wherein if the counter attempts counting N times, N being a positive integer greater than 1, the determination circuit terminates the counting when the determination circuit determines the count value satisfying the predetermined criterion before the number of counting times reaches the N times.

12. The filter automatic adjustment apparatus according to claim 1, wherein counting of the counter is re-started to make another determination, when the count value satisfying the predetermined criterion does not exist.

13. The filter automatic adjustment apparatus according to claim 1, wherein an error display is performed or a previous count value stored in a register is used as the count value, when a determination is made the plurality of times and the count value satisfying the predetermined criterion does not exist.

14. A mobile telephone system comprising:
- a main filter which performs filtering of an input signal with a characteristic frequency to output a signal;
- a filter automatic adjustment apparatus according to claim 1 which adjusts the characteristic frequency of the main filter to a target frequency; and
- a baseband processing unit which converts the output signal of the main filter into voice or data.

15. A filter automatic adjustment method for adjusting a characteristic frequency of a main filter to a target frequency, comprising:
- inputting a signal of the target frequency to a reference filter;
- detecting a phase difference between an input signal and an output signal of the reference filter to output a phase difference detection signal having a duty ratio corresponding to the phase difference;
- converting the phase difference detection signal into a rectangular wave to output the rectangular wave;
- consecutively counting a length of a predetermined interval of the rectangular wave a
- selecting a count value satisfying a predetermined criterion from a plurality of count values of the plurality of times;
- decoding a control signal for adjusting the characteristic frequency of the main filter to the target frequency based on the selected count value;
- storing the control signal in a register; and
- adjusting the characteristic frequency of the main filter based on the control signal.

* * * * *